US006944217B1

(12) United States Patent
Allen

(10) Patent No.: US 6,944,217 B1
(45) Date of Patent: Sep. 13, 2005

(54) INTERLEAVED FINITE IMPULSE RESPONSE FILTER

(75) Inventor: Brian L. Allen, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/496,111

(22) Filed: Feb. 1, 2000

(51) Int. Cl.[7] ............................................. H03K 5/159
(52) U.S. Cl. ...................................... 375/229; 375/350
(58) Field of Search .............................. 375/224, 232, 375/233, 350

(56) References Cited

U.S. PATENT DOCUMENTS

| | | | |
|---|---|---|---|
| 3,665,171 A | | 5/1972 | Morrow |
| 5,103,416 A | * | 4/1992 | Cavallotti et al. .......... 708/319 |
| 5,623,377 A | * | 4/1997 | Behrens et al. ................ 360/65 |
| 5,668,831 A | * | 9/1997 | Claydon et al. ............ 375/232 |
| 5,692,006 A | | 11/1997 | Ross |
| 5,729,574 A | | 3/1998 | Suchoff et al. |
| 6,188,344 B1 | * | 2/2001 | Eastty et al. ................. 341/143 |
| 6,466,277 B1 | * | 10/2002 | McNeely ..................... 341/143 |

* cited by examiner

Primary Examiner—Mohammed Ghayour
Assistant Examiner—Pankaj Kumar
(74) Attorney, Agent, or Firm—McGinn & Gibb, PLLC; Richard A. Henkler, Esq.

(57) ABSTRACT

A non-recursive filter for receiving samples and generating a filtered signal, the filter comprises a plurality of successive partial summation units, each partial summation unit having multiplier for multiplying an undelayed state of each of the samples, and an adder for adding multiplied samples; and a plurality of delay elements each coupled to the adder for receiving added samples and for providing a delayed output of the added samples to a successive partial summation unit.

17 Claims, 2 Drawing Sheets

INTERLEAVED FINITE IMPULSE RESPONSE FILTER

BACKGROUND OF THE INVENTION

1. Field of the Invention

The present invention generally relates to digital filters and more particularly to an improved interleaved digital filter that eliminates the need for pipeline stages and, in turn, decreases in the number of latches required in the filter, which decreases the power and space required by the filter

2. Description of the Related Art

Finite impulse response digital filters are commonly used to perform arithmetic operations on digital signals (samples) of data. The speed of digital filters is limited by the internal components of the filters. Generally, with full rate design conventional digital filters, one sample can be filtered per cycle. In order to process multiple samples per cycle, an interleaved (half rate) digital filter is utilized.

Interleaved digital filters receive multiple samples (odd and even samples) per cycle and process the odd and even samples in parallel. Therefore, an interleaved digital filter can operate at twice the speed of a full rate design digital filter because the interleaved digital filter processes twice the number of samples per cycle.

However, the disadvantage of interleaved filters is that they include twice the number of multipliers, adders and storage elements when compared to full rate design digital filters. Therefore, the interleaved digital filter are twice as expensive to manufacture and twice as large as a full rate digital filters. However, the interleaved digital filters consume only about the same amount of power as the full rate digital filters because, while the interleaved design requires twice as many elements, the elements operate at half the frequency, which results in an approximately equal power consumption.

FIG. 1 is a schematic diagram of a conventional direct Form 1 interleaved architecture filter. Such a filter is described in greater detail in U.S. Pat. No. 3,665,171, which is incorporated fully herein by reference. More specifically, FIG. 1 illustrate the inputs 10, 11 for the even and odd samples. The samples are multiplied by multipliers h0–h9 after being delayed by the delay elements D. The multiplied samples are then processed through pipelines stages 12 before being added by adders 13. The pipeline stages 12 are necessary to avoid having more than two inputs is supplied to any of the adders 13 during any cycle. The pipeline stages are necessary because there is not enough time to multiply all of the samples and sum them in one cycle. A pipeline stage is used to allow the multiplication to take one cycle and the summation of all the multiplier outputs to take one cycle. Final summation units 14 produce the odd and even filter outputs.

Since all of the multiplier h0–h9 outputs need to be summed at once, pipeline stages 12 are used. The pipeline stages 12 consists of storage elements that hold the outputs of the multipliers for one clock cycle. However, the pipeline stages 12 add an extra cycle of latency and increase the total number of storage elements. Therefore, there is a need to eliminate the pipeline stages 12 from digital filters so that the size of the filter, its associated manufacturing costs, and its power consumption can be reduced.

SUMMARY OF THE INVENTION

It is, therefore, an object of the present invention to provide a structure and method of a non-recursive filter for receiving samples and generating a filtered signal. The filter includes at least one input for receiving the samples, a plurality of summation units, and a plurality of delay elements positioned between the summation units. Each of the summation units includes at least one multiplier directly connected to the input (the multiplier multiplies the samples and providing multiplied samples) and at least one adder connected to the multiplier (the adder adds the multiplied samples and provides added samples). The delay elements receive the added samples and provide a delayed output of the added samples to a successive summation unit. Each of the delay elements is connected to an adder of the successive partial summation unit.

The non-recursive filter further comprises an initial delay element connected to an initial multiplier. The initial delay unit supplies an initial delayed sample to an adder of an initial summation unit. The multiplier receives the samples in an undelayed state. Each of the summation units may include two of the multipliers supplying the multiplied sample to a single adder.

In another embodiment, the non-recursive filter comprises a plurality of successive partial summation units, each partial summation unit having a multiplier for multiplying an undelayed state of each of the samples, an adder for adding multiplied samples, and a plurality of delay elements each coupled to the adder for receiving added samples and for providing a delayed output of the added samples to a successive partial summation unit.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
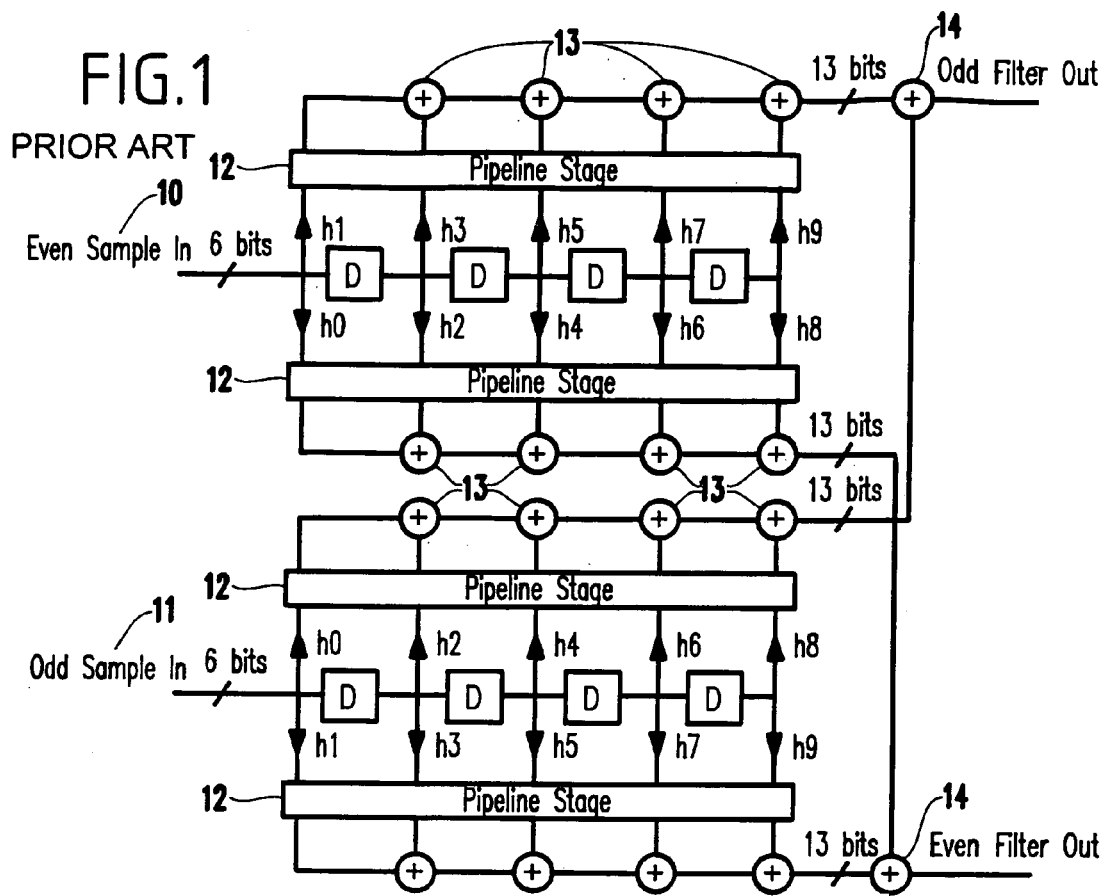
FIG. 1 is a schematic diagram of a conventional interleaved digital filter.
Figure 2:
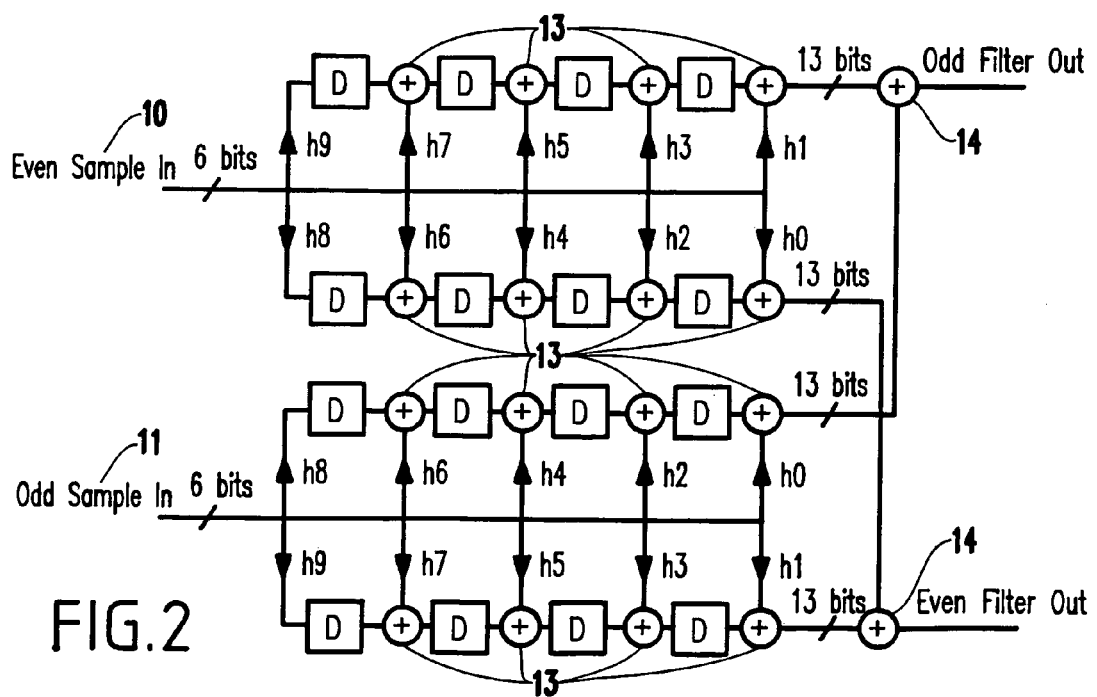
FIG. 2 is a schematic diagram of an interleaved digital filter according to a preferred embodiment of the invention.

A first embodiment of the invention is illustrated in FIG. 2. As discussed with respect to FIG. 1 above, the inventive structure also includes odd and even sample inputs 10, 11, multipliers h0–h9, delay elements D, adders 13, and odd and even filter outputs 14. As would be known by one ordinarily skilled in the art given this disclosure, the multipliers h0–h9 can be constructed in various ways (e.g., table lookup, sign magnitude, two's complement, etc.) without affecting the spirit of the invention. Similarly, the adders can be constructed in various ways (ripple carry, carry save, carry lookahead, etc.) and still not affect the spirit of the design. The delay blocks D include a number of storage elements where data is clocked in each clock cycle. Once again, as would be known, the delay elements D can be constructed in various ways (D flip flops, latches, etc.) and still not affect the invention. For a given sample input, x0, x1, x2, x3, x4, x5 . . . , the even sample input 10 is commonly referred to as x0, x2, x4 . . . and the odd sample input 11 is referred to as x1, x3, x5 . . .

However, while the invention includes many of the same basic elements shown in FIG. 1, the invention is fundamentally different than conventional structures because the invention eliminates the pipeline stages 12. More specifically, since all the multiplier outputs are summed between delay elements, together at once, a pipeline stage 12 is not needed. This allows the latency of the inventive architecture to be one less than the structure shown in FIG. 1 and requires less storage elements than FIG. 1. Therefore, the invention is smaller, less expensive to produce, and consumes less power than conventional filters, such as the one shown in FIG. 1.

As shown in FIG. 2, the invention relocates the delay units D such that the delay units D are positioned between the adders 13. Further, the multipliers h0–h9 receive the sample input in an undelayed state because the multipliers are directly connected to the sample inputs 10, 11. This structure insures that the adders 13 will receive only two inputs per cycle (because of the function of the delay elements D) which eliminates the need for pipeline stages 12.

Figure 3:
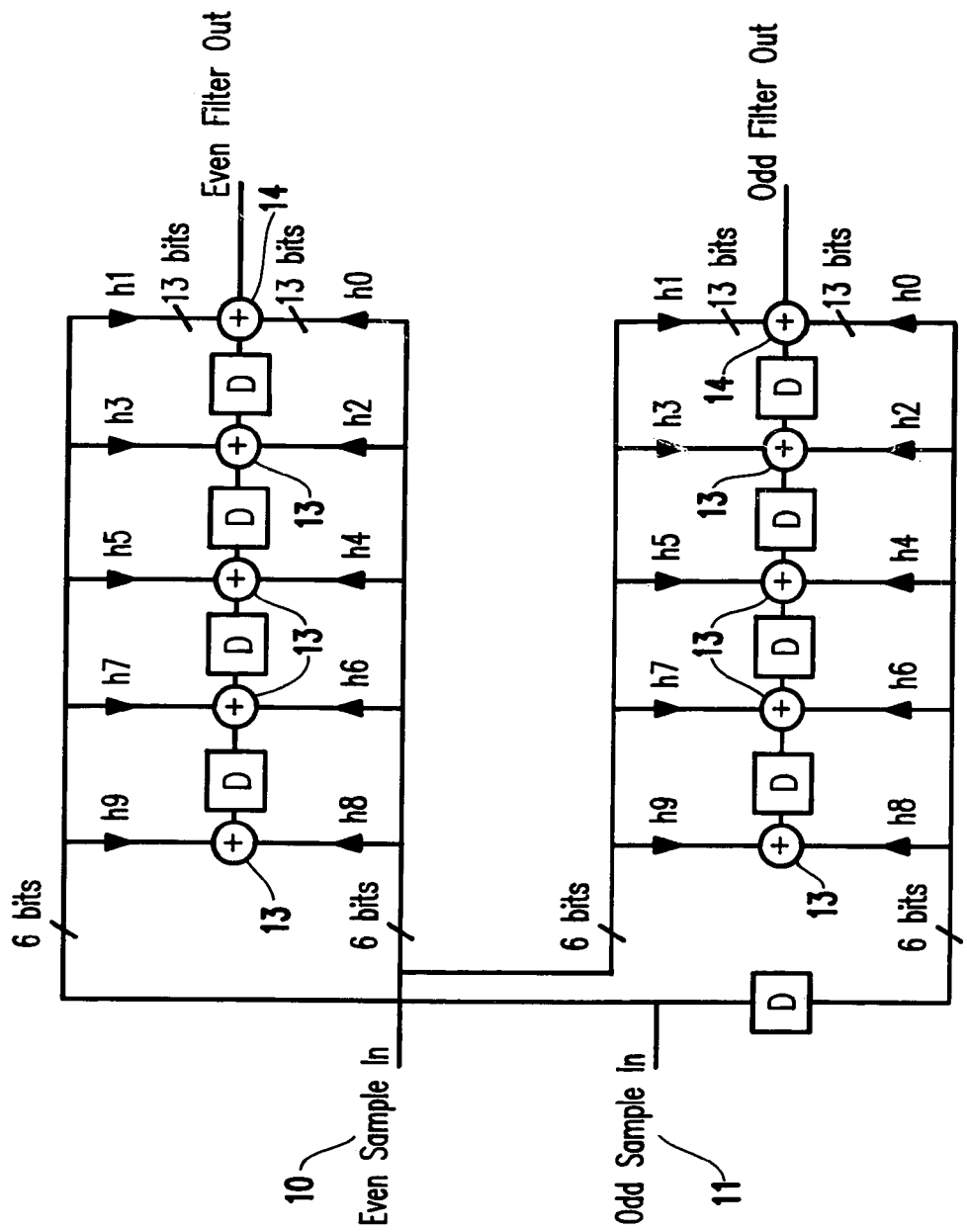
FIG. 3 is a schematic diagram of an interleaved digital filter according to another embodiment of the invention.

FIG. 3 is an improvement to the embodiment shown in FIG. 2. Rather than keeping even sample and odd sample computations separate until the final addition 14, the even and odd sample computations are combined and share the same storage elements. More specifically, with the embodiment shown in FIG. 3, each of the adders 13 is placed between two multipliers (e.g., h9 and h8), one of which is connected to the even sample input 10 and the other of which is connected to the odd sample input 11. Again, a delay element D is placed between the adders 13 to ensure that each adders 13 does not receive more than two inputs per cycle. In FIG. 3 there are actually 3 inputs to the adder. In FIG. 3, the filter can be an interleaved non-recursive filter receiving odd and even samples, where the single adder receives an odd multiplied sample from one multiplier and an even multiplied sample from a second multiplier, depending on configuration. FIG. 2 adders receive odd multiplied samples and delayed odd multiplied samples. A final adder then adds the odd and even components together. In FIG. 3 the above statement is correct. In FIG. 2, the delay elements control the samples such that each of the adders receives at most two of the samples. For FIG. 3, there are 3 inputs to the adder, the delayed partial sum, a odd multiplier output, and an even multiplier output. This structure further reduces size by eliminating half of the delay devices D, when compared to the structure shown in FIG. 2. The embodiment shown in FIG. 3 has the same latency and approximately half the number of storage elements as the structure shown in FIG. 2.

The example structure shown in FIG. 1 includes 8 delay elements D each having six latches, which results in 48 total latches for the delay elements D. Each of the two overall pipeline stages includes 130 latches resulting in a total of 260 latches for the pipeline stages 12. Therefore, the example shown in FIG. 1 includes a total of 308 latches.

To the contrary, to the structure shown in FIG. 2 does not include any pipeline latches but instead includes 16 delay elements D each having 13 latches, resulting in a total of 208 latches. Therefore, FIG. 2 reduces the total latches by 100 when compared to FIG. 1. The structure shown in FIG. 3 reduces the number of latches even further. More specifically, FIG. 3 includes 8 delay elements D having 13 latches each and 1 delay element containing 6 latches each, which results in a total of 110 latches. Thus, the invention lowers latency (1 cycle) and uses approximately 65% less storage than conventional filters.

As discussed above, the invention reduces the size and cost of the filter by reducing the number of latches required. An additional benefit produced by the invention is a reduction in power consumption. Latches represent a large percentage of the power requirements of a filter. Since, again, the number of latches has been substantially reduced (e.g., 308 verses 110) the amount of power consumed by the inventive the filter is substantially reduced.

While the invention has been described in terms of preferred embodiments, those skilled in the art will recognize that the invention can be practiced with modification within the spirit and scope of the appended claims.

What is claimed is:

1. A non-recursive filter for receiving samples and generating a filtered signal, said filter comprising:
   a first input for receiving even samples;
   a second input for receiving odd samples;
   two sets of summation units, wherein a first set of summation units has an even output and a second set of said summation units has an odd output, and wherein each set of summation units includes a plurality of summation units, each of said summation units comprising:
      two multipliers directly connected to said input, said multipliers multiplying said samples and providing multiplied samples; and
      an adder connected to said multipliers, said adder adding said multiplied samples and providing added samples; and
      a plurality of delay elements positioned between said summation units, said delay elements receiving said added samples and providing a delayed output of said added samples to a successive summation unit of said summation units.

2. The non-recursive filter in claim 1, wherein each of said delay elements is connected to an adder of said successive summation unit.

3. The non-recursive filter in claim 1, further comprising an initial delay element connected to an initial multiplier, said initial delay unit supplying an initial delayed sample to an adder of an initial summation unit.

4. The non-recursive filter in claim 1, wherein said multipliers receive said samples in an undelayed state.

5. The non-recursive filter in claim 1, wherein said non-recursive filter comprises an interleaved non-recursive filter receiving odd and even samples and said adder receives an odd multiplied sample from one of said two multipliers and an even multiplied sample from a second of said two multipliers.

6. The non-recursive filter in claim 1, wherein said delay elements control said samples such that each of said adders receives at most two of said samples.

7. A non-recursive filter for receiving samples and generating a filtered signal, said filter comprising:
   two sets of successive partial summation units, wherein a first set of successive partial summation units has an even output and a second set of said successive partial summation units has an odd output, and wherein each set of successive partial summation units includes a plurality of successive partial summation units, each partial summation unit having two multipliers for multiplying an undelayed state of each of said samples, and an adder for adding multiplied samples; and
   a plurality of delay elements each coupled to said adder for receiving added samples and for providing a delayed output of said added samples to a successive partial summation unit.

8. The non-recursive filter in claim 7, wherein each of said delay elements is connected to an adder of said successive partial summation unit.

9. The non-recursive filter in claim 7, further comprising an initial delay element connected to an initial multiplier, said initial delay unit supplying an initial delayed sample to an adder of an initial summation unit.

10. The non-recursive filter in claim 7, wherein said multipliers receive said samples in an undelayed state.

11. The non-recursive filter in claim 7, wherein said non-recursive filter comprises an interleaved non-recursive filter receiving odd and even samples and said adder receives an odd multiplied sample from one of said two multipliers and an even multiplied sample from a second of said two multipliers.

12. The non-recursive filter in claim 7, wherein said delay elements control said samples such that each of said adders receives at most two of said samples.

13. An interleaved non-recursive filter for receiving samples and generating a filtered signal, said filter comprising:
 a first input for receiving even samples;
 a second input for receiving odd samples;
 two sets of summation units, wherein a first set of summation units has an even output and a second set of said summation units has an odd output, and wherein each set of summation units includes:
  a plurality of multipliers directly connected to said input, said multipliers multiplying said samples and providing multiplied samples;
  a plurality of adders, each of said adders being connected to two of said multipliers, said adders adding said multiplied samples and providing added samples; and
  a plurality of delay elements positioned between said adders, said delay elements receiving said added samples and providing a delayed output of said added samples to a successive adder of said adders.

14. The interleaved non-recursive filter in claim 13, further comprising an initial delay element connected to an initial multiplier, said initial delay unit supplying an initial delayed sample to an initial adder.

15. The interleaved non-recursive filter in claim 13, wherein said multipliers receive said samples in an undelayed state.

16. The interleaved non-recursive filter in claim 13, wherein said samples comprise odd and even samples and said adder receives an odd multiplied sample from one of said two multipliers and an even multiplied sample from a second of said two multipliers.

17. The interleaved non-recursive filter in claim 13, wherein said delay elements control said samples such that each of said adders receives at most two of said samples.

* * * * *